US011561263B2

United States Patent
Tian (10) Patent No.: US 11,561,263 B2
(45) Date of Patent: Jan. 24, 2023

(54) METHOD AND DEVICE FOR TESTING ADAPTOR, AND STORAGE MEDIUM

(71) Applicant: GUANGDONG OPPO MOBILE TELECOMMUNICATIONS CORP., LTD., Guangdong (CN)

(72) Inventor: Chen Tian, Guangdong (CN)

(73) Assignee: GUANGDONG OPPO MOBILE TELECOMMUNICATIONS CORP., LTD., Dongguan (CN)

(*) Notice: Subject to any disclaimer, the term of this patent is extended or adjusted under 35 U.S.C. 154(b) by 470 days.

(21) Appl. No.: 16/743,540

(22) Filed: Jan. 15, 2020

(65) Prior Publication Data

US 2020/0150188 A1 May 14, 2020

Related U.S. Application Data (63) Continuation of application No. PCT/CN2018/109224, filed on Sep. 30, 2018.

(51) Int. Cl.
*G01R 31/42* (2006.01)
*G01R 19/165* (2006.01)
*H02P 29/024* (2016.01)
*H02J 7/00* (2006.01)

(52) U.S. Cl.
CPC ....... *G01R 31/42* (2013.01); *G01R 19/16595* (2013.01); *H02J 7/00308* (2020.01); *H02P 29/0241* (2016.02)

(58) Field of Classification Search
CPC .. G01R 31/42; G01R 19/16595; G01R 31/40; G01R 19/16547; H02J 7/00308; H02P 29/0241
See application file for complete search history.

(56) References Cited

U.S. PATENT DOCUMENTS

| 11,329,493 | B2* | 5/2022 | Tian ................. G01R 19/16528 |
| 2004/0108843 | A1 | 6/2004 | Lanni |
| 2008/0197831 | A1 | 8/2008 | Kokubun et al. |
| 2011/0254582 | A1 | 10/2011 | Partee |
| 2013/0181729 | A1 | 7/2013 | Egan et al. |
| 2017/0179741 | A1 | 6/2017 | Tian et al. |

(Continued)

FOREIGN PATENT DOCUMENTS

| CN | 103795040 A | 5/2014 |
| CN | 104965139 A | 10/2015 |
| CN | 204882749 U | 12/2015 |

(Continued)

OTHER PUBLICATIONS

Extended European search report issued in corresponding European application No. 18934645.5 dated Nov. 9, 2020.

(Continued)

*Primary Examiner* — Lee E Rodak (74) *Attorney, Agent, or Firm* — Young Basile Hanlon & MacFarlane, P.C.

(57) ABSTRACT

Provided are a method and device for testing an adaptor, and a storage medium. The method is applicable to the device. The method includes the following. A test signal is sent to the adaptor. Detect a first voltage, where the first voltage is outputted in a preset first duration by the adaptor according to the test signal. A working state of the adaptor is determined according to the first voltage.

14 Claims, 6 Drawing Sheets

(56) References Cited

U.S. PATENT DOCUMENTS

2018/0252777 A1* 9/2018 Straub .................... G01R 31/40

FOREIGN PATENT DOCUMENTS

| | | |
|---|---|---|
| CN | 105896645 A | 8/2016 |
| CN | 105915036 A | 8/2016 |
| CN | 206020564 U | 3/2017 |
| JP | H05173733 A | 7/1993 |

OTHER PUBLICATIONS

International search report with English Translation issued in corresponding international application No. PCT/CN2018/109224 dated Jun. 28, 2019.
Japanese Notice of Reasons for Refusal with English Translation for JP Application 2021504459 dated Dec. 17, 2021. (10 pages).
Chinese Office Action with English Translation for CN Application 201880033230.4 dated Nov. 18, 2021. (23 pages).
Indian Examination Report for IN Application 202017002354 dated Jun. 14, 2021. (6 pages).
Communication pursuant to Article 94(3) EPC for EP Application 18934645.5 dated Jul. 16, 2021. (6 pages).
Japanese Notice of Reasons for Refusal with English Translation for JP Application 2021504459 dated Jul. 22, 2022. (8 pages).
Extended European Search Report for EP Application 22165853.7 dated Jul. 18, 2022. (9 pages).

* cited by examiner

METHOD AND DEVICE FOR TESTING ADAPTOR, AND STORAGE MEDIUM

CROSS-REFERENCE TO RELATED APPLICATION(S)

This application is a continuation of International Application No. PCT/CN2018/109224, filed on Sep. 30, 2018, the disclosure of which is hereby incorporated by reference in its entirety.

TECHNICAL FIELD

This disclosure relates to electronic technology, and relates to but is not limited to a method and device for testing an adaptor, and a storage medium.

BACKGROUND

In supplying power to a terminal via an adaptor, a protection mechanism and a charging mechanism of the adaptor are of vital importance to safety of the terminal. For example, when a working voltage currently required by a mobile phone is undervoltage or overvoltage, if the protection mechanism of the adaptor fails, the adaptor is unable to be promptly disconnected from the mobile phone or be reset, which can result in burnout or breakdown of a circuit inside the mobile phone or even result in battery explosion of the mobile phone. For another example, the working voltage currently required by the mobile phone is a voltage at which the mobile phone can work safely, but the charging mechanism of the adaptor fails, as an example, an undervoltage current or an overvoltage current is applied to the mobile phone, which also results in burnout or breakdown of the circuit inside the mobile phone or even results in battery explosion.

Currently, however, only unit test is performed on the adaptor. For example, when the adaptor is in a working mode, the adaptor is tested to determine whether components in the adaptor meet requirements. However, when the adaptor is in a charging mode, that is, the adaptor is coupled with the terminal for charging, it is impossible to test a working state of the adaptor.

SUMMARY

In a first aspect, a method for testing an adaptor is provided. The method is applicable to a testing device. The method includes the following. A test signal is sent to the adaptor. Detect a first voltage, where the first voltage is outputted in a preset first duration by the adaptor according to the test signal. A working state of the adaptor is determined according to the first voltage.

In a second aspect, a testing device is provided. The testing device includes a processor and a memory configured to store computer programs which, when executed by the processor, are operable with the processor to: send a test signal to the adaptor; detect a first voltage, wherein the first voltage is outputted in a preset first duration by the adaptor according to the test signal; determine a working state of the adaptor according to the first voltage; output a test result according to the working state determined.

In a third aspect, a computer readable storage medium is provided. The computer readable storage medium is configured to store computer programs which, when executed by a processor, are operable with the processor to: send a test signal to the adaptor; detect a first voltage, wherein the first voltage is outputted in a preset first duration by the adaptor according to the test signal; determine a working state of the adaptor according to the first voltage; output a test result according to the working state determined, where the test signal comprises one of a first test signal for causing the adaptor to launch a protection mechanism or a second test signal for causing the adaptor to launch a charging mechanism.

DETAILED DESCRIPTION

Technical solutions of implementations will be described in detail in connection with the accompanying drawings.

A method for testing an adaptor is provided. The method is applicable to a testing device. Functions of the method can be implemented by invoking program codes by a processor in the testing device. The program codes can be stored in a computer storage medium. The testing device includes at least the processor and a storage medium.

Figure 1A:
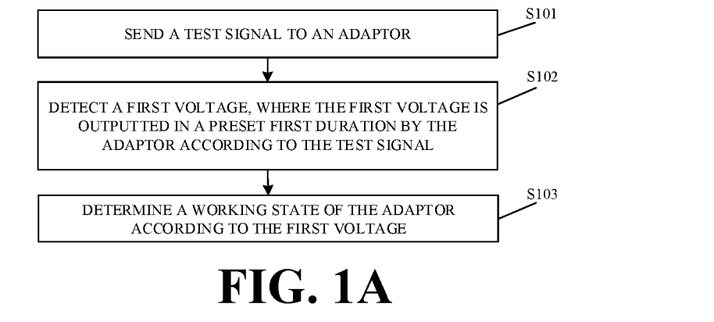
FIG. 1A is a schematic flowchart of a method for testing an adaptor according to implementations.

FIG. 1A is a schematic flowchart of a method for testing an adaptor according to implementations. As illustrated in FIG. 1A, the method begins at block S101.

At block S101, a test signal is sent to the adaptor.

At block S102, detect a first voltage, where the first voltage is outputted in a preset first duration by the adaptor according to the test signal.

In general, a starting point of the first duration is a time at which the test signal is sent to the adaptor, and an ending point of the first duration is the starting point+theoretical response time taken after receiving the test signal (such as 20 ms (millisecond)). It can be understood that, the first voltage outputted by the adaptor is an input voltage of the testing device.

At block S103, a working state of the adaptor is determined according to the first voltage.

According to implementations, the method for testing an adaptor is provided. The method is applicable to the testing device. After sending the test signal to the adaptor, the testing device detects the first voltage which is outputted in the preset first duration by the adaptor according to the test signal and determines the working state of the adaptor according to the first voltage. In this way, the testing device sends the test signal to the adaptor, when the adaptor is supplying power to the testing device, automated testing of the working state of the adaptor (for example, a protection mechanism and a charging mechanism (also known as power-supply mechanism)) can be achieved according to the first voltage outputted by the adaptor, which overcomes disadvantages of only performing unit test on the adaptor.

Figure 1B:
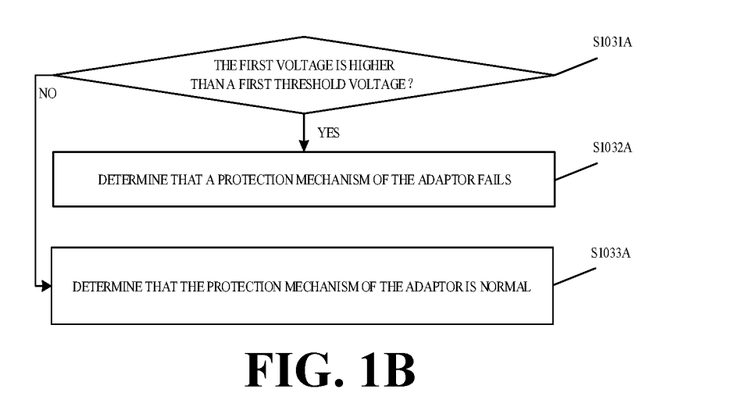
FIG. 1B is a schematic flowchart illustrating a process of determining a working state of an adaptor according to implementations.

In some implementations, as illustrated in FIG. 1B, when the test signal is a first test signal for causing the adaptor to launch a protection mechanism, in block S103, the working state of the adaptor is determined according to the first voltage as follows.

At block S1031A, detect whether the first voltage is higher than a first threshold voltage. If yes, proceed to operations at block S1032A. If not, proceed to operations at block S1033A.

In practical application, the protection mechanism refers to a protection function intended for avoiding burnout or breakdown of a terminal or even battery explosion. In supplying power to the terminal by the adaptor, if the adaptor applies an abnormal output voltage (such as undervoltage current or overvoltage current) to the terminal when the terminal experiences abnormality (such as instructing the adaptor to output undervoltage current or overvoltage current), burnout or breakdown of the terminal or even battery explosion may occur, and the protection mechanism is provided in this regard. Therefore, in order to test whether the protection mechanism of the adaptor fails, the first test signal is sent to the adaptor to guide the adaptor to launch the protection mechanism, and then the method proceeds to operations at block S1031A, to detect whether the protection mechanism of the adaptor is in fault. In addition, in order to save testing costs, practically, the testing device is usually used to simulate the terminal, and the testing device can be implemented with a testing board.

It can be understood that, if the test signal is the first test signal, then based on the first test signal, the first voltage outputted by the adaptor according to the test signal is theoretically 0, that is, the adaptor has been disconnected from the testing device, alternatively, the adaptor is coupled again with the testing device after being disconnected from the testing device, that is, the adaptor realizes the protection mechanism through reset. Therefore, in practice, the first threshold voltage is usually set to be 0.

At block S1032A, determine that the working state of the adaptor is that the protection mechanism of the adaptor fails.

At block S1033A, determine that the working state of the adaptor is that the protection mechanism of the adaptor is normal.

It can be understood that, if the first voltage is higher than the first threshold voltage, it indicates that the protection mechanism of the adaptor fails. If the first voltage is lower than or equal to the first threshold voltage, it indicates that the protection mechanism of the adaptor is normal, that is, does not fail.

In some implementations, the first test signal is a first signal for instructing the adaptor to output a third voltage, where the third voltage is not within a first voltage range in which the testing device (that is, the terminal) can work safely, that is, a voltage range in which burnout or breakdown of the terminal or battery explosion will not occur. Accordingly, the third voltage can be an undervoltage value or an overvoltage value. In this situation, before sending the first signal, the electronic load of the testing device can be adjusted until the working voltage currently required by the testing device becomes the third voltage, and then the first signal is generated according to the third voltage.

Alternatively, the first test signal is a first communication instruction which the adaptor is unable to recognize. It can be understood that, if the protection mechanism of the adaptor is normal, upon receiving the first communication instruction, the adaptor will launch the protection mechanism, for example, be disconnected from the testing device or be reset. On the contrary, if the protection mechanism of the adaptor fails, upon receiving the first communication instruction, the adaptor will not launch the protection mechanism, and instead, the adaptor will continue to output voltage to the testing device.

Alternatively, the first test signal is a second communication instruction which is sent to the adaptor by the testing device according to a first timing, where the second communication instruction is an instruction which can be recognized by the adaptor, and the first timing is a timing other than that specified by a communication protocol between the testing device and the adaptor.

Alternatively, the first test signal is indicative of an input alternating current (AC) voltage of the adaptor, where the input AC voltage is not within a voltage range in which the adaptor can work safely. In practice, the input AC voltage of the adaptor can be set by a host computer, and the first test signal which carries the input AC voltage of the adaptor is generated and then sent to the testing device. The first signal is forwarded by the testing device to the adaptor, such that a present input voltage of the adaptor is the input AC voltage indicated by the first test signal. For example, the input AC voltage of the adaptor set by the host computer is lower than 70V (volt) or higher than 90V.

Figure 1C:
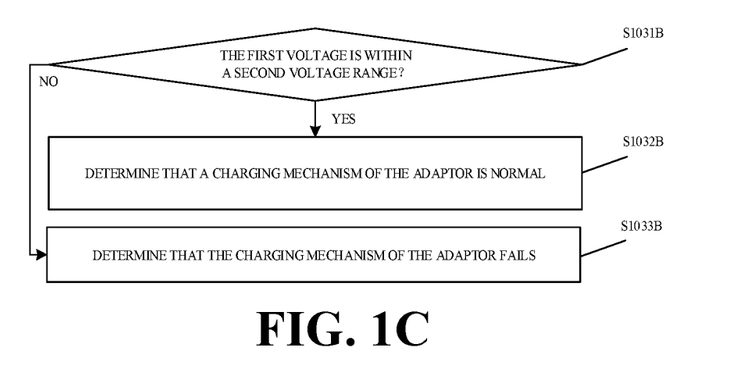
FIG. 1C is a schematic flowchart illustrating a process of determining a working state of an adaptor according to other implementations.

In some implementations, as illustrated in FIG. 1C, when the test signal is a second test signal for causing the adaptor to launch a charging mechanism, at block S103, the working state of the adaptor is determined according to the first voltage as follows.

At S1031B, whether the first voltage is within a second voltage range is detected. If yes, proceed to operations at block S1032B. If not, proceed to operations at block S1033B.

It can be understood that, in practical application, through the charging mechanism, the adaptor can properly apply (according to the second test signal) to the testing device a voltage at which the testing device can work safely. Therefore, the second voltage range is a voltage range corresponding to the first voltage in which the testing device can work safely. For example, the first voltage is 80V, and accordingly the corresponding second voltage range is [75V, 85V].

At block S1032B, determine that the working state of the adaptor is that a charging mechanism of the adaptor is normal.

At block S1033B, determine that the working state of the adaptor is that the charging mechanism of the adaptor fails.

It can be understood that, if the charging mechanism of the adaptor is normal, the adaptor will output according to an output voltage indicated by the second test signal. Therefore, whether the charging mechanism of the adaptor is in fault can be detected through operations at block S1031B. If the first voltage is within the second voltage range, it indicates that the charging mechanism of the adaptor is normal. If the first voltage is not within the second voltage range, it indicates that the charging mechanism of the adaptor fails.

In other implementations, the second test signal is a second signal for instructing the adaptor to output a fourth voltage, and the fourth voltage is within the first voltage range. Practically, the value of the fourth voltage can be directly set by the host computer which is coupled with the testing device and then be encapsulated into the second signal by the host computer or the testing device to be sent to the adaptor. Alternatively, an electronic load of the testing device is adjusted until a working voltage currently required by the testing device is the fourth voltage. For example, the electronic load of the testing device is reduced until the fourth voltage is an undervoltage value, or the electronic load of the testing device is increased until the fourth voltage is an overvoltage value. Then the second signal is generated based on the fourth voltage.

In this situation, before sending the second signal, the electronic load of the testing device can be adjusted until the working voltage currently required by the testing device becomes the fourth voltage, and then the second signal is generated according to the fourth voltage.

Alternatively, the second test signal is a third communication instruction which can be recognized by the adaptor.

Alternatively, the second test signal is a fourth communication instruction which is sent according to a second timing, where the fourth communication instruction is an instruction which can be recognized by the adaptor, and the second timing is a timing specified by the communication protocol between the testing device and the adaptor.

Figure 2:
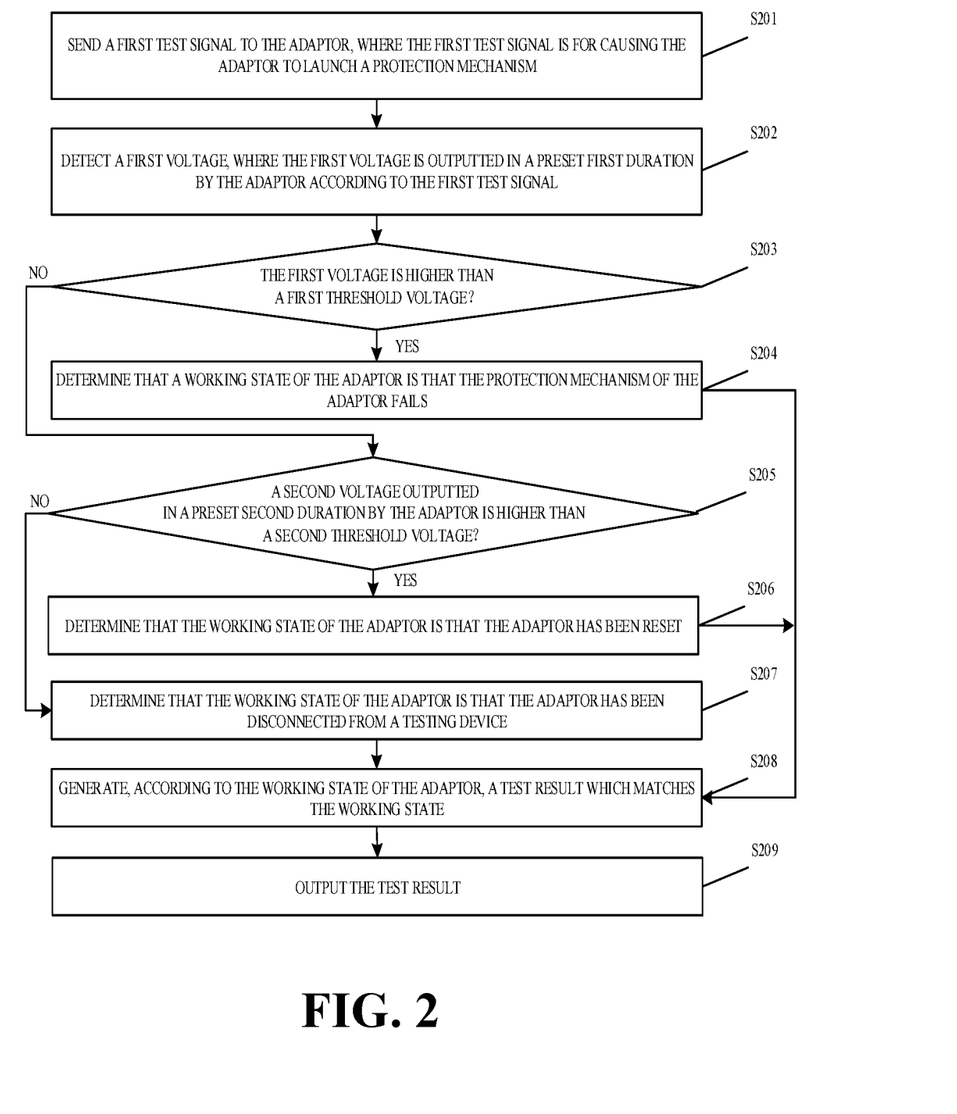
FIG. 2 is a schematic flowchart of a method for testing an adaptor according to other implementations.

A method for testing an adaptor according to other implementations is provided. The method is applicable to the testing device. FIG. 2 is a schematic flowchart of a method for testing an adaptor according to other implementations. As illustrated in FIG. 2, the method begins at block S201.

At block S201, a first test signal is sent to the adaptor, where the first test signal is for causing the adaptor to launch a protection mechanism.

It is to be noted that, the first test signal is one kind of the test signals mentioned in description of operations at block S101.

At block S202, detect a first voltage, where the first voltage is outputted in a preset first duration by the adaptor according to the first test signal.

At block S203, detect whether the first voltage is higher than a first threshold voltage. If yes, proceed to operations at block S204. If not, proceed to operations at block S205.

At block S204, determine that a working state of the adaptor is that the protection mechanism of the adaptor fails, and then proceed to operations at block S208.

It can be understood that, for the convenience of testing members to determine the reason for the failure in the protection mechanism of the adaptor, in operations at block S208, a test result can be generated based on the reason for the failure in the protection mechanism (that is, the type of the first test signal). For example, when the first test signal is the first signal for instructing the adaptor to output the third voltage, and the third voltage is beyond the first voltage range in which the testing device can work safely, the adaptor is unable to launch the protection mechanism. Based on that, a first test result is generated, where the first test result is for indicating that the adaptor is unable to launch the protection mechanism when the working voltage currently required by the testing device is overvoltage or undervoltage. For another example, when the first test signal is the first communication instruction which cannot be recognized by the adaptor and the adaptor is unable to launch the protection mechanism, a second test result is generated based on the above, where the second test result is for indicating that the adaptor is unable to launch the protection mechanism when a communication instruction sent by the testing device is an instruction which is unrecognized by the adaptor. For another example, the first test signal is the second communication instruction which is sent to the adaptor by the testing device according to the first timing, where the second communication instruction is an instruction which can be recognized by the adaptor, and the first timing is a timing other than that specified by the communication protocol between the testing device and the adaptor. In this situation, if the adaptor is unable to launch the protection mechanism, a third test result is generated, where the third test result is for indicating that the adaptor is unable to launch the protection mechanism even though the timing according to which the testing device sends a communication instruction is abnormal.

At block S205, detect whether a second voltage outputted in a preset second duration by the adaptor is higher than a second threshold voltage. If yes, proceed to operations at block S206. If not, proceed to operations at block S207.

The second duration is later than the first duration. In general, the second threshold voltage is equal to the first threshold voltage.

At block S206, determine that the working state of the adaptor is that the adaptor has been reset, and then proceed to operations at block S208.

In practical situations, in order for testing members to determine the type of the protection mechanism through which the adaptor protects the testing device, in operations at block S208, the test result can be generated based on protection operations of the adaptor. For example, the adaptor is reset when the first test signal is the first signal for instructing the adaptor to output the third voltage and the third voltage is beyond the first voltage range in which the testing device can work safely. Based on that, a fourth test result is generated, where the fourth test result is for indicating that the adaptor is reset to protect the testing device when the working voltage currently required by the testing device is overvoltage or undervoltage. For another example, the adaptor is reset when the first test signal is the first communication instruction which cannot be recognized by the adaptor. A fifth test result is generated based on this, where the fifth test result is for indicating that the adaptor is reset to protect the testing device when a communication instruction sent by the testing device cannot be recognized by the adaptor. For another example, the first test signal is the second communication instruction which is sent to the adaptor by the testing device according to the first timing, where the second communication instruction is an instruction which can be recognized by the adaptor, and the first timing is a timing other than that specified by the communication protocol between the testing device and the adaptor. In this situation, if the adaptor is reset, a sixth test result is generated, where the sixth test result is for indicating that the adaptor is reset to protect the testing device if the timing according to which the testing device sends a communication instruction is abnormal.

At block S207, determine that the working state of the adaptor is that the adaptor has been disconnected from the testing device, and then proceed to operations at block S208.

Similarly, when the first test signal is the first signal for instructing the adaptor to output the third voltage and the third voltage is beyond the first voltage range in which the testing device can work safely, the adaptor is disconnected from the testing device, that is, disables output. Based on that, a seventh test result in generated, where the seventh test result is for indicating that the adaptor disables output to protect the testing device when the working voltage currently required by the testing device is overvoltage or undervoltage. For another example, the adaptor is disconnected from the testing device when the first test signal is the first communication instruction which cannot be recognized by the adaptor. Based on that, an eighth test result is generated, where the eighth test result is for indicating that the adaptor disables output to protect the testing device when a communication instruction sent by the testing device cannot be recognized by the adaptor. For another example, the first test signal is the second communication instruction which is sent to the adaptor by the testing device according to the first timing, where the second communication instruction is an instruction which can be recognized by the adaptor, and the first timing is a timing other than that specified by the communication protocol between the testing device and the adaptor. In this situation, if the adaptor has been disconnected from the testing device, a ninth test result is generated, where the ninth test result is for indicating that the adaptor disables output to protect the testing device if the timing according to which the testing device sends a communication instruction is abnormal.

When the adaptor has been reset or has been disconnected from the testing device, operations at block S208 and block S209 may be skipped. In other words, when the protection mechanism of the adaptor is normal, no test result is outputted.

At block S208, a test result which matches the working state of the adaptor is generated according to the working state.

At block S209, the test result is outputted.

In practice, the testing device is coupled with the host computer, and therefore the test result can be outputted to the host computer for display.

Figure 3:
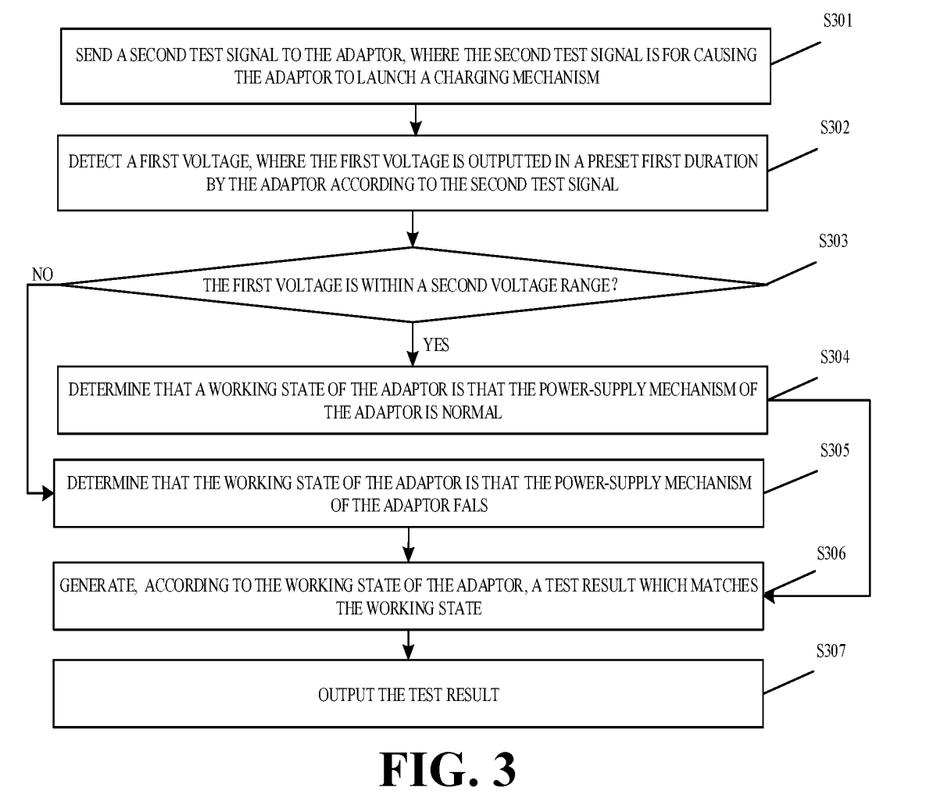
FIG. 3 is a schematic flowchart of a method for testing an adaptor according to other implementations.

A method for testing an adaptor according to other implementations is provided. The method is applicable to the testing device. FIG. 3 is a schematic flowchart of a method for testing an adaptor according to other implementations. As illustrated in FIG. 3, the method begins at block S301.

At block S301, a second test signal is sent to the adaptor, where the second test signal is for causing the adaptor to launch a charging mechanism.

It can be understood that, when the charging mechanism of the adaptor is normal, an output voltage of the adaptor depends on a working voltage currently required by a terminal (here, the terminal is simulated by the testing device). In other words, the output voltage of the adaptor depends on a load (such as a mobile phone) coupled with the adaptor. The adaptor is able to provide whatever magnitude of voltage required by the mobile phone as long as such magnitude is within the capability of the adaptor. If the voltage required by the mobile phone is higher than an upper-limit voltage which the adaptor is able to provide, the adaptor will be maintained to output the upper-limit voltage.

It is to be noted that, the second test signal is another kind of test signals mentioned in operations at block S101.

At block S302, detect a first voltage, where the first voltage is outputted in a preset first duration by the adaptor according to the second test signal.

At block S303, detect whether the first voltage is within a second voltage range. If yes, proceed to operations at block S304. If not, proceed to operations at block S305.

The second voltage range is a voltage range corresponding to the second test signal, and in the second voltage range, the testing device can work safely. For example, the second voltage range is [75V, 85V].

At block S304, determine that a working state of the adaptor is that the charging mechanism of the adaptor is normal, and then proceed to operations at block S306.

It is to be noted that, upon determining that the charging mechanism of the adaptor is normal, operations at block S306 and block S307 may be skipped, that is, the test result may not be outputted.

At block S305, determine that the working state of the adaptor is that the charging mechanism of the adaptor fails, and then proceed to operations at block S306.

Similarly, for the convenience of testers to determine the reason for failure in the charging mechanism of the adaptor, in operations at block S306, the test result can be generated based on the reason for failure in the charging mechanism of the adaptor (that is, the type of the second test signal). For example, when the second test signal is the second signal for instructing the adaptor to output the fourth voltage and the fourth voltage is within the first voltage range, if the first voltage outputted by the adaptor is beyond the second voltage range, a tenth test result is generated. The tenth test result is for indicating that the adaptor is unable to output the fourth voltage when the second test signal sent by the testing device is the second signal for instructing the adaptor to output the fourth voltage and the fourth voltage is within the first voltage range. For another example, the second test signal is the third communication instruction which can be recognized by the adaptor, but the first voltage outputted by the adaptor is beyond the second voltage range. An eleventh test result in generated based on this, where the eleventh test result is for indicating that the adaptor is unable to recognize the third communication instruction which should be recognized by the adaptor. For another example, the second test signal is the fourth communication instruction which is sent according to the second timing, where the fourth communication instruction is an instruction which can be recognized by the adaptor and the second timing is a timing specified by the communication protocol between the testing device and the adaptor. In this case, if the first voltage outputted by the adaptor is beyond the second voltage range, a twelfth test result is generated, where the twelfth test result is for indicating that the adaptor is unable to recognize a correct timing when the testing device sends a communication instruction according to the correct timing.

At block S306, a test result which matches the working state of the adaptor is generated according to the working state.

At S307, the test result is outputted.

In practice, the testing device is coupled with the host computer. Therefore, the test result can be outputted to the host computer for display.

According to implementations, the testing board (that is, the testing device) communicates with the adaptor. For example, the testing board simulates communication abnormality and then the output state of the adaptor (that is, the first voltage) is detected with the testing board, thereby determining whether the adaptor is in a protection state, for example, whether the adaptor has disabled the output (that is, the adaptor has been disconnected from the testing board, and the first voltage is 0) or has been restarted (that is, has been reset).

Figure 4A:
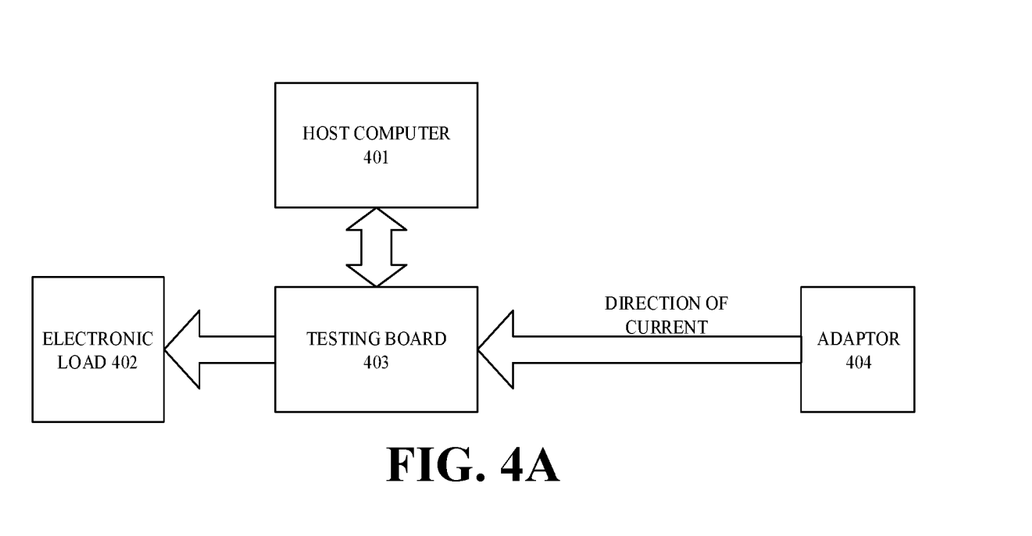
FIG. 4A is a schematic structural diagram of a testing system according to implementations.

Based on foregoing implementations, a testing system is provided. FIG. 4A is a schematic structural diagram of a testing system according to implementations. As illustrated in FIG. 4A, the testing system 40 includes a host computer 401, an electronic load 402, a testing board 403, and an adaptor 404. The host computer 401 is coupled with the testing board 403 and is configured to control the type of a test signal (that is, the content of the test signal) and send the test signal to the testing board 403. The electronic load 402, together with the testing board 403, is configured to simulate a terminal (such as a mobile phone). The adaptor 404 is configured to supply power to the testing board 403 and the electronic load 402.

Figure 4B:
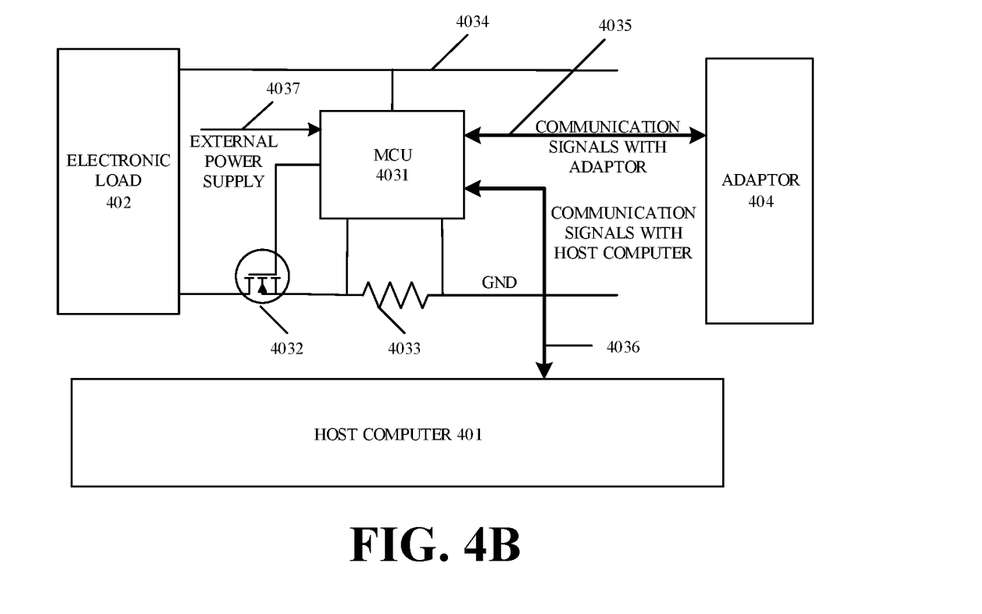
FIG. 4B is a schematic structural diagram of a testing board according to implementations.

In other examples, as illustrated in FIG. 4B, the testing board 403 includes a microcontroller unit (MCU) 4031, a metal-oxide-semiconductor field-effect transistor (MOSFET) 4032, a resistor 4033, a first line 4034, a second line 4035, a third line 4036, and a fourth line 4037. The first line 4034 has a first end coupled with the adaptor 404, a second end coupled with the MCU 4031, and a third end coupled with the electronic load 402, whereby the adaptor 404 supplies power to the testing board 403 and the electronic load 402. The second line 4035 has one end coupled with the MCU 4031 and the other end coupled with the adaptor 404 to achieve communication between the MCU 4031 and the adaptor 404, that is, to communicate signals with the adaptor 404 (for example, the test signal in the foregoing implementations). The third line 4036 has one end coupled with the host computer 401 and the other end coupled with the MCU 4031, to achieve communication between the MCU 4031 and the host computer 401, that is, to communicate signals with the host computer 401. The fourth line 4037 is configured to supply power to the MCU 4031 when the adaptor 404 disables output. The MOSFET 4032, together with the resistor 4033, is configured to simulate hardware loads other than the electronic load 402.

It is to be noted that, in practical application, the testing board 403 can report to the host computer 401 the output state currently detected (such as voltage and current) of the adaptor 404. The testing board 403 simulates communication abnormality, for example, sends an incorrect communication signal (such as the first communication instruction and the second communication instruction), and meanwhile monitors the output voltage of the adaptor 404. For example, the testing board 403 detects whether the first line 4034 is reconnected within a certain time period which has elapsed after being disconnected and re-provides voltage and current. If yes, determine that the adaptor 404 has been reset. If the first line 4034 has not been reconnected within a certain time period which has elapsed after being disconnected, determine that the adaptor 404 has entered a protection state in which output is disabled.

Based on the foregoing implementations, an apparatus for testing an adaptor is provided. Various modules included in the apparatus and various units included in various modules can be implemented by a processor of the apparatus or by logic circuits. During the implementation, the processor may be a CPU, an MPU, a DSP, or an FPGA.

Figure 5A:
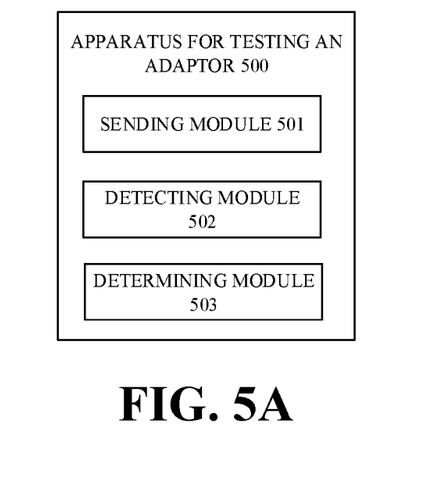
FIG. 5A is a schematic structural diagram of an apparatus for testing an adaptor according to implementations.

FIG. 5A is a schematic structural diagram of an apparatus for testing an adaptor according to implementations. As illustrated in FIG. 5A, the apparatus 500 includes a sending module 501, a detecting module 502, and a determining module 503. The sending module 501 is configured to send a test signal to the adaptor. The detecting module 502 is configured to detect a first voltage, where the first voltage is outputted in a preset first duration by the adaptor according to the test signal. The determining module 503 is configured to determine a working state of the adaptor according to the first voltage.

Figure 5B:
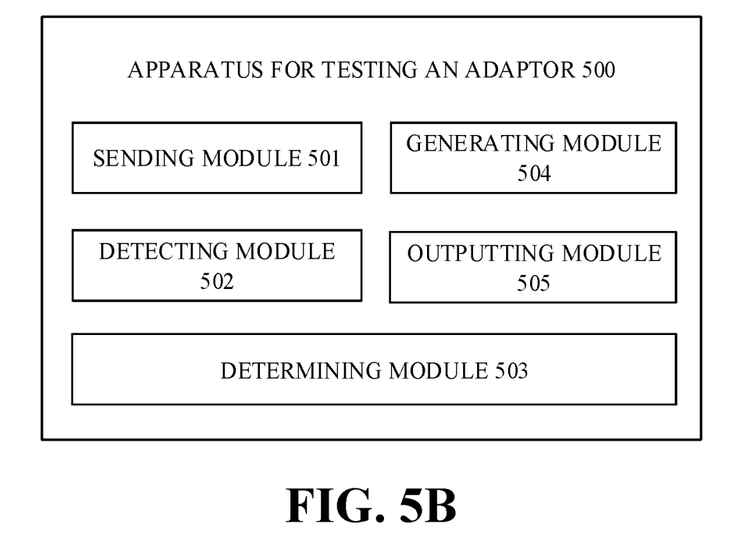
FIG. 5B is a schematic structural diagram of an apparatus for testing an adaptor according to other implementations.

In some examples, as illustrated in FIG. 5B, the apparatus further includes a generating module 504 and an outputting module 505. The generating module 504 is configured to generate, according to the working state of the adaptor, a test result which matches the working state. The outputting module 505 is configured to output the test result.

In some examples, the determining module 503 includes a first detecting unit S031, a first determining unit S032, and a second determining unit S033 which are operable when the test signal is a first test signal for causing the adaptor to launch a protection mechanism. The first detecting unit S031 is configured to detect whether the first voltage is higher than a first threshold voltage. The first determining unit S032 is configured to determine that the working state of the adaptor is that the protection mechanism of the adaptor fails when the first voltage is higher than the first threshold voltage. The second determining unit S033 is configured to determine that the working state of the adaptor is that the protection mechanism of the adaptor is normal when the first voltage is lower than or equal to the first threshold voltage.

In some examples, the second determining unit S033 is configured to operate as follows. The second determining unit S033 is configured to detect whether a second voltage outputted in a preset second duration by the adaptor is higher than a second threshold voltage, where the second duration is later than the first duration. The second determining unit S033 is configured to determine that the adaptor has been reset when the second voltage is higher than the second threshold voltage. The second determining unit S033 is configured to determine that the adaptor has been disconnected from a testing device when the second voltage is lower than or equal to the second threshold voltage.

Figure 5C:
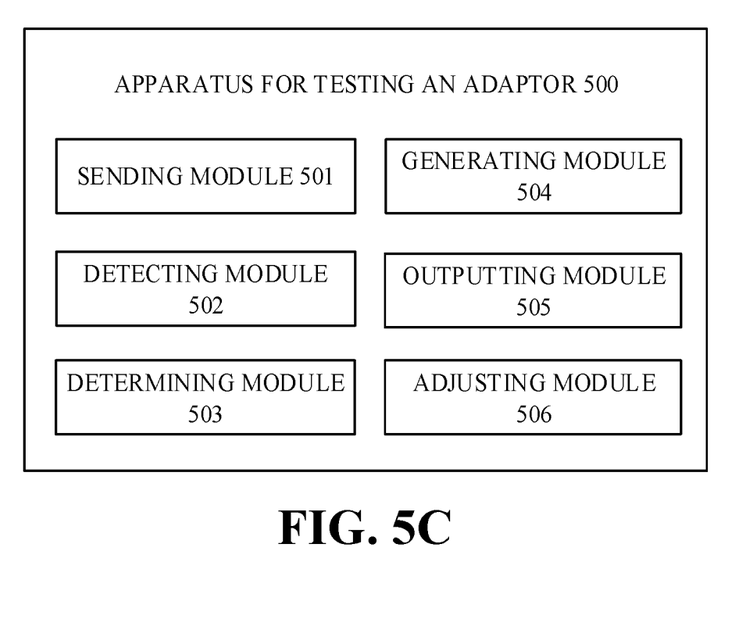
FIG. 5C is a schematic structural diagram of an apparatus for testing an adaptor according to other implementations.

In some examples, the first test signal is a first signal for instructing the adaptor to output a third voltage, and the third voltage is beyond a first voltage range in which the testing device can work safely. Alternatively, the first test signal is a first communication instruction which the adaptor is unable to recognize. Alternatively, the first test signal is a second communication instruction which is sent to the adaptor by the testing device according to a first timing, where the second communication instruction is an instruction which can be recognized by the adaptor, and the first timing is a timing other than that specified by a communication protocol between the testing device and the adaptor. Alternatively, the first test signal is indicative of an input AC voltage of the adaptor, where the input AC voltage is beyond a voltage range in which the adaptor can work safely. In some examples, as illustrated in FIG. 5C, the apparatus 500 further includes an adjusting module 506. The adjusting module 506 is configured to adjust an electronic load of the testing device until a working voltage currently required by the testing device is the third voltage. The generating module 504 is configured to generate the first signal according to the third voltage.

In some examples, the determining module 503 includes a second detecting unit S034, a third determining unit S035, and a fourth determining unit S036 which are operable when the test signal is a second test signal for causing the adaptor to launch a charging mechanism. The second detecting unit S034 is configured to detect whether the first voltage is within a second voltage range. The third determining unit S035 is configured to determine that the working state of the adaptor is that a charging mechanism of the adaptor fails when the first voltage is beyond the second voltage range. The fourth determining unit S036 is configured to determine that the working state of the adaptor is that the charging mechanism of the adaptor is normal when the first voltage is within the second voltage range.

In some examples, the second test signal is a second signal for instructing the adaptor to output a fourth voltage, and the fourth voltage is within the first voltage range.

Alternatively, the second test signal is a third communication instruction which can be recognized by the adaptor. Alternatively, the second test signal is a fourth communication instruction which is sent according to a second timing, where the fourth communication instruction is an instruction which can be recognized by the adaptor, and the second timing is a timing specified by the communication protocol between the testing device and the adaptor. In some examples, as illustrated in FIG. 5C, the apparatus 500 further includes an adjusting module 506. The adjusting module 506 is configured to adjust an electronic load of the testing device until a working voltage currently required by the testing device becomes the fourth voltage. The generating module 504 is configured to generate the second signal according to the fourth voltage.

Description of apparatus implementations is similar to description of method implementations. The apparatus implementations have advantages that are similar to those of the method implementations. For technical details not disclosed in the apparatus implementations, reference may be made to the method implementations.

It is to be noted that, if the method for testing an adaptor described above is implemented as a software functional unit and sold or used as a standalone product, it may be stored in a computer readable storage medium. Based on such an understanding, the essential technical solution, or the portion that contributes to the related art may be embodied as software products. The computer software products can be stored in a storage medium and may include multiple instructions that, when executed, can cause the testing device to execute some or all operations of the methods described in various implementations. The above storage medium may include various kinds of media that can store program codes, such as a universal serial bus (USB) flash disk, a mobile hard drive, a read only memory (ROM), a magnetic disk, or an optical disk. There is no particular restriction on the combination of software and hardware in implementations.

Figure 6:
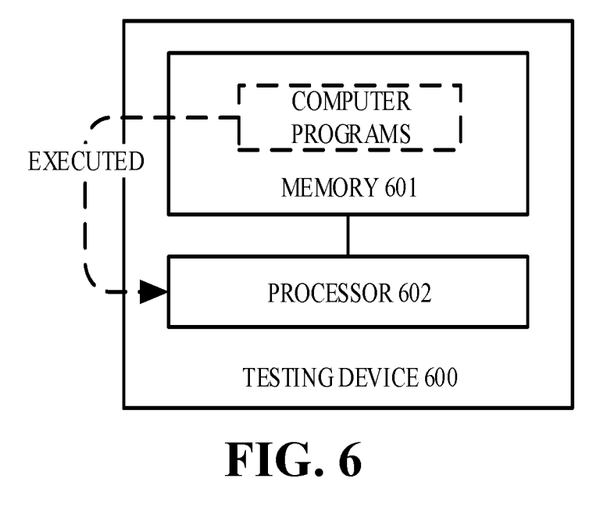
FIG. 6 is a schematic hardware entity diagram of a testing device according to implementations.

Correspondingly, a testing device is provided in implementations. FIG. 6 is a schematic hardware entity diagram of a testing device according to implementations. As illustrated in FIG. 6, the testing device 600 includes a processor 602 and a memory 601 configured to store computer programs which, when executed by the processor 602, are operable with the processor 602 to perform the method for testing an adaptor described above.

It is to be noted that, the memory 601 is configured to store instructions and applications operable with the processor 602. The memory 601 may also be configured to buffer data that is to be processed or has been processed by the processor 602 and various modules of the testing device 600 (such as image data, audio data, voice communication data, and video communication data). The memory 601 may be implemented as a flash memory or a random access memory (RAM).

Correspondingly, a computer readable storage medium is provided. The computer readable storage medium is configured to store computer programs which, when executed by a processor, are operable with the processor to perform the method for testing an adaptor described above.

In some implementations, when executed by a processor, the computer programs are operable with the processor to: send a test signal to the adaptor; detect a first voltage, wherein the first voltage is outputted in a preset first duration by the adaptor according to the test signal; determine a working state of the adaptor according to the first voltage; output a test result according to the working state determined, where the test signal comprises one of a first test signal for causing the adaptor to launch a protection mechanism or a second test signal for causing the adaptor to launch a charging mechanism.

When the test signal is the first test signal, the computer programs operable with the processor to determine the working state of the adaptor according to the first voltage are operable with the processor to: determine whether the first voltage is higher than a first threshold voltage; determine that the protection mechanism of the adaptor fails, in response to the first voltage being higher than the first threshold voltage; determine that the protection mechanism of the adaptor is normal, in response to the first voltage being lower than or equal to the first threshold voltage.

When the test signal is the second test signal, the computer programs operable with the processor to determine the working state of the adaptor according to the first voltage are operable with the processor to: determine whether the first voltage is within a second voltage range; determine that the charging mechanism of the adaptor fails, in response to the first voltage being beyond the second voltage range; and determine that the charging mechanism of the adaptor is normal, in response to the first voltage being within the second voltage range.

It is to be noted that, description of storage medium implementations and the apparatus implementations is similar to description of the method implementations. The storage medium implementations and the apparatus implementations have advantages that are similar to those of the method implementations. For technical details not disclosed in the storage medium implementations and the apparatus implementations, reference may be made to the method implementations.

It is to be understood that the phrase "one implementation" or "an implementation" means that the particular features, structures, or characteristics related to implementations are included in at least one implementation. Therefore, the phrase "in one implementation" or "in an implementation" appearing in various places of the specification does not necessarily refer to the same implementation. In addition, these particular features, structures, or characteristics may be combined in any proper manner in one or more implementations. It should be understood that, in various implementations herein, the sequence numbers of various processes described above do not mean the order of execution. Instead, the order of execution of each process should be determined by its function and internal logic and should not be taken as limitations of implementations. The sequence numbers of the implementations herein are merely for description and do not represent the advantages and disadvantages of the implementations.

It is to be understood that the term "include", "comprise", or any other variants thereof is intended to encompass a non-exclusive inclusion, such that a process, method, article, or device including a series of elements includes not only those elements but also other elements that are not explicitly listed, or elements that are inherent to such a process, method, article, or device. An element that is defined by the phrase "including a . . . " does not exclude the presence of additional equivalent elements in the process, method, item, or device that includes the element.

It will be appreciated that the apparatuses and methods disclosed in implementations herein may also be implemented in various other manners. The above apparatus implementations are merely illustrative, e.g., the division of units is only a division of logical functions, and there may exist other manners of division in practice, e.g., multiple units or assemblies may be combined or may be integrated into another system, or some features may be ignored or skipped. In other respects, the coupling or direct coupling or communication connection as illustrated or discussed may be an indirect coupling or communication connection through some interface, device or unit, and may be electrical, mechanical, or otherwise.

Separated units as illustrated may or may not be physically separated. Components displayed as units may or may not be physical units, and may reside at one location or may be distributed to multiple networked units. Some or all of the units may be selectively adopted according to practical needs to achieve desired objectives of the implementations.

Additionally, various functional units described in implementations herein may be integrated into one processing unit or may be present as a number of physically separated units, and two or more units may be integrated into one. The integrated unit may take the form of hardware or hardware plus software functional unit.

It will be understood by those skilled in the art that all or part of the steps of implementing the foregoing method implementations may be performed by hardware related to program instructions. The programs may be stored in a computer readable storage medium, and when executed, the programs perform operations including the foregoing method implementations. The storage medium includes various kinds of media which can store program codes, such as a portable storage device, a ROM, a magnetic disk, an optical disk, and the like.

If the integrated units are implemented as software functional units and sold or used as standalone products, they may be stored in a computer readable storage medium. Based on such an understanding, the essential technical solution or the portion that contributes to the related art may be embodied as software products. The computer software products can be stored in a storage medium and may include multiple instructions that, when executed, can cause the testing device to execute some or all operations of the methods described in various implementations. The above storage medium may include various kinds of media that can store program codes, such as a portable storage device, a ROM, a magnetic disk, an optical disk, and the like.

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law.

INDUSTRIAL APPLICABILITY

According to implementations, a method for testing an adaptor is provided. The method is applicable to a testing device. After sending a test signal to the adaptor, the testing device detects a first voltage which is outputted in a preset first duration by the adaptor according to the test signal and determines a working state of the adaptor according to the first voltage. In this way, the testing device sends the test signal to the adaptor, and as such, during power supply of the adaptor to the testing device, automated testing of the working state of the adaptor (for example, a protection mechanism and a charging mechanism) can be achieved according to the first voltage outputted by the adaptor, which overcomes disadvantages of only performing unit test on the adaptor.

What is claimed is:

1. A method for testing an adaptor, performed by a testing device and comprising:
   sending a test signal to the adaptor;
   detecting a first voltage, wherein the first voltage is outputted in a preset first duration by the adaptor according to the test signal; and
   determining a working state of the adaptor according to the first voltage;
   wherein when the test signal is a first test signal for causing the adaptor to launch a protection mechanism, the working state of the adaptor refers to whether the protection mechanism of the adaptor is normal, and determining the working state of the adaptor according to the first voltage comprises:
      detecting whether the first voltage is higher than a first threshold voltage;
      determining that the protection mechanism of the adaptor fails, in response to the first voltage being higher than the first threshold voltage; and
      determining that the protection mechanism of the adaptor is normal, in response to the first voltage being lower than or equal to the first threshold voltage;
   wherein,
   the first test signal is one of:
      a first signal for instructing the adaptor to output a third voltage, and the third voltage is beyond a first voltage range in which the testing device can work safely;
      a first communication instruction which the adaptor is unable to recognize; or
      a second communication instruction which the adaptor is able to recognize, wherein the second communication instruction is sent to the adaptor by the testing device according to a first timing, wherein the first timing is a timing other than that specified by a communication protocol between the testing device and the adaptor; or
   the first test signal is indicative of an input alternating current (AC) voltage of the adaptor, wherein the input AC voltage is beyond a voltage range in which the adaptor can work safely.

2. The method of claim 1, further comprising:
   generating, according to the working state of the adaptor, a test result which matches the working state; and
   outputting the test result.

3. The method of claim 1, wherein determining that the protection mechanism of the adaptor is normal comprises:
   detecting whether a second voltage outputted in a preset second duration by the adaptor is higher than a second threshold voltage, wherein the second duration is later than the first duration;
   determining that the adaptor has been reset, in response to the second voltage being higher than the second threshold voltage; and
   determining that that the adaptor has been disconnected from the testing device, in response to the second voltage being lower than or equal to the second threshold voltage.

4. The method of claim 1, further comprising:
   adjusting an electronic load of the testing device until a working voltage currently required by the testing device becomes the third voltage; and
   generating the first signal according to the third voltage.

5. The method of claim 1, wherein when the test signal is a second test signal for causing the adaptor to launch a charging mechanism, the working state of the adaptor refers to whether the charging mechanism of the adaptor is normal, and determining the working state of the adaptor according to the first voltage comprises:
   detecting whether the first voltage is within a second voltage range;
   determining that the charging mechanism of the adaptor fails, in response to the first voltage being beyond the second voltage range; and
   determining that the charging mechanism of the adaptor is normal, in response to the first voltage being within the second voltage range.

6. The method of claim 5, wherein the second test signal is one of:
   a second signal for instructing the adaptor to output a fourth voltage, and the fourth voltage is within the first voltage range;
   a third communication instruction which the adaptor is able to recognize; or
   a fourth communication instruction which the adaptor is able to recognize, wherein the fourth communication instruction is sent to the adaptor according to a second timing specified by the communication protocol between the testing device and the adaptor.

7. The method of claim 6, further comprising:
   adjusting an electronic load of the testing device until a working voltage currently required by the testing device becomes the fourth voltage; and
   generating the second signal according to the fourth voltage.

8. A device for testing an adaptor, the device comprising a processor and a memory configured to store computer programs which, when executed by the processor, are operable with the processor to:
   send a test signal to the adaptor;
   detect a first voltage, wherein the first voltage is outputted in a preset first duration by the adaptor according to the test signal;
   determine a working state of the adaptor according to the first voltage; and
   output a test result according to the working state determined;
   wherein when the test signal is a first test signal for causing the adaptor to launch a protection mechanism, the working state of the adaptor refers to whether the protection mechanism of the adaptor is normal, and the computer programs operable with the processor to determine the working state of the adaptor according to the first voltage are operable with the processor to:
   determine whether the first voltage is higher than a first threshold voltage;
   determine that the protection mechanism of the adaptor fails, in response to the first voltage being higher than the first threshold voltage; and
   determine that the protection mechanism of the adaptor is normal, in response to the first voltage being lower than or equal to the first threshold voltage; wherein
   the first test signal is one of:
   a first signal for instructing the adaptor to output a third voltage, wherein the third voltage is beyond a first voltage range in which the device can work safely;
   a first communication instruction which the adaptor is unable to recognize; or
   a second communication instruction which the adaptor is able to recognize, wherein the second communication instruction is sent to the adaptor by the device according to a first timing, and the first timing is a timing other than that specified by a communication protocol between the device and the adaptor; or
   the first test signal is indicative of an input alternating current (AC) voltage of the adaptor, wherein the input AC voltage is beyond a voltage range in which the adaptor can work safely.

9. The device of claim 8, wherein the computer programs operable with the processor to determine that the protection mechanism of the adaptor is normal are operable with the processor to:
   detect whether a second voltage outputted in a preset second duration by the adaptor is higher than a second threshold voltage, wherein the second duration is later than the first duration;
   determine that the adaptor has been reset when the second voltage is higher than the second threshold voltage; and
   determine that the adaptor has been disconnected from the device when the second voltage is lower than or equal to the second threshold voltage.

10. The device of claim 8, wherein when the test signal is a second test signal for causing the adaptor to launch a charging mechanism, the working state of the adaptor refers to whether the charging mechanism of the adaptor is normal, and the computer programs operable with the processor to determine the working state of the adaptor according to the first voltage are operable with the processor to:
    detect whether the first voltage is within a second voltage range;
    determine that the charging mechanism of the adaptor fails, in response to the first voltage being beyond the second voltage range; and
    determine that the charging mechanism of the adaptor is normal, in response to the first voltage being within the second voltage range.

11. The device of claim 10, wherein the second test signal is one of:
    a second signal for instructing the adaptor to output a fourth voltage, and the fourth voltage is within the first voltage range;
    a third communication instruction which the adaptor is able to recognize; or
    a fourth communication instruction which the adaptor is able to recognize, wherein the fourth communication instruction is sent by the device according to a second timing specified by a communication protocol between the device and the adaptor.

12. The device of claim 11, wherein the computer programs are further operable with the processor to:
    adjust an electronic load of the device until a working voltage currently required by the device becomes the fourth voltage; and
    generate the second signal according to the fourth voltage.

13. A non-transitory computer readable storage medium configured to store computer programs which, when executed by a processor, are operable with the processor to:
    send a test signal to an adaptor;
    detect a first voltage, wherein the first voltage is outputted in a preset first duration by the adaptor according to the test signal;
    determine a working state of the adaptor according to the first voltage; and
    output a test result according to the working state determined, wherein
    the test signal comprises one of a first test signal for causing the adaptor to launch a protection mechanism or a second test signal for causing the adaptor to launch a charging mechanism; wherein when the test signal is the first test signal, the computer programs operable with the processor to determine the working state of the adaptor according to the first voltage are operable with the processor to:
determine whether the first voltage is higher than a first threshold voltage;
determine that the protection mechanism of the adaptor fails, in response to the first voltage being higher than the first threshold voltage; and
determine that the protection mechanism of the adaptor is normal, in response to the first voltage being lower than or equal to the first threshold voltage; and the first test signal is one of:
a first signal for instructing the adaptor to output a third voltage, and the third voltage is beyond a first voltage range in which the testing device can work safely;
a first communication instruction which the adaptor is unable to recognize; or
a second communication instruction which the adaptor is able to recognize, wherein the second communication instruction is sent to the adaptor by the testing device according to a first timing, wherein the first timing is a timing other than that specified by a communication protocol between the testing device and the adaptor; or
the first test signal is indicative of an input alternating current (AC) voltage of the adaptor, wherein the input AC voltage is beyond a voltage range in which the adaptor can work safely.

14. The non-transitory computer readable storage medium of claim 13, wherein
when the test signal is the second test signal, the computer programs operable with the processor to determine the working state of the adaptor according to the first voltage are operable with the processor to:
determine whether the first voltage is within a second voltage range;
determine that the charging mechanism of the adaptor fails, in response to the first voltage being beyond the second voltage range; and
determine that the charging mechanism of the adaptor is normal, in response to the first voltage being within the second voltage range.

* * * * *